(12) United States Patent
Kang et al.

(10) Patent No.: US 7,282,431 B2
(45) Date of Patent: Oct. 16, 2007

(54) SINGLE CHIP AND STACK-TYPE CHIP SEMICONDUCTOR PACKAGE AND METHOD OF MANUFACTURING THE SAME

(75) Inventors: In-Ku Kang, Chungcheongnam-do (KR); Sung-Hwan Yoon, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/618,134

(22) Filed: Dec. 29, 2006

(65) Prior Publication Data
US 2007/0102802 A1    May 10, 2007

Related U.S. Application Data

(62) Division of application No. 10/945,640, filed on Sep. 20, 2004, now Pat. No. 7,176,558.

(30) Foreign Application Priority Data
Sep. 19, 2003   (KR) ................... 2003-65226

(51) Int. Cl.
*H01L 21/44* (2006.01)
*H01L 23/495* (2006.01)

(52) U.S. Cl. ........................ 438/612; 257/676

(58) Field of Classification Search ............. 257/672, 257/676, 782, 784; 438/123, 461, 611–613
See application file for complete search history.

(56) References Cited

U.S. PATENT DOCUMENTS 6,787,915 B2   9/2004  Uchida et al.
2004/0089930 A1   5/2004  Beroz

FOREIGN PATENT DOCUMENTS

JP   10-70232        3/1998
KR   2000-0061035    10/2000
KR   2002-0079015    10/2002

OTHER PUBLICATIONS

English language abstract of Japanese Publication No. 10-70232.
English language abstract of Korean Publication No. 2000-0061035.
English language abstract of Korean Publication No. 2002-0079015.

*Primary Examiner*—Calvin Lee
(74) *Attorney, Agent, or Firm*—Marger Johnson & McCollom, P.C.

(57) ABSTRACT

A semiconductor package comprises a substrate having connection pads disposed thereon, a semiconductor chip attached to the substrate such that an active surface of the semiconductor chip faces the substrate, and external bonding pads electrically connected to the active surface of the semiconductor chip. The external bonding pads may be formed near the ends of the frame and have an upper surface facing away from the substrate. The external bonding pads are electrically connected with the connection pads.

13 Claims, 5 Drawing Sheets

SINGLE CHIP AND STACK-TYPE CHIP SEMICONDUCTOR PACKAGE AND METHOD OF MANUFACTURING THE SAME

This application is a Divisional of U.S. patent application Ser. No. 10/945,640, filed on Sep. 20, 2004, and issued as U.S. Pat. No. 7,176,558, which claims the priority of Korean Patent Application No. 2003-65226, filed on Sep. 19, 2003 in the Korean Intellectual Property Office, the disclosures of which are incorporated herein in their entirety by reference.

BACKGROUND OF THE INVENTION

1. Field of the Invention

The present invention relates to a semiconductor package and a method of manufacturing the same, and more particularly, to a single chip semiconductor package and a method of manufacturing the same, and a stack-type semiconductor package comprising the single chip semiconductor package and a method of manufacturing the same.

2. Description of the Related Art

Packaging is the final stage in a semiconductor manufacturing process. Packaging electrically connects semiconductor chips to external devices, protects semiconductor chips from potential damage, and dissipates heat generated by semiconductor chips. The packaged semiconductor chip is then installed in an electronic device, such as a computer or mobile device.

Recent developments have made electronic devices smaller, lighter and thinner, while the devices are becoming higher performance. In order to meet these requirements, several methods of packaging have been introduced. Among them, a flip chip package (FCP) method, a chip scale package (CSP) method, and a multi-chip package (MCP) method are widely used. Recently, a wafer level package (WLP) method has been developed.

The multi-chip package comprises two or more semiconductor chips, which are packed together on a substrate. Multi-chip packages may also comprise different kinds of semiconductor chips. Chip arrangements for a multi-chip package include a planar arrangement and a vertically stacked arrangement. Vertical stacking is advantageous in chip scale packages (CSP) since it (hereinafter, stack-type chip semiconductor package) reduces semiconductor package area. However, thickness is a drawback in the stack-type chip semiconductor package. Therefore, it is desirable that the thickness of the stack-type chip semiconductor package be reduced.

Generally, in a conventional semiconductor package comprising bonding wires, a semiconductor chip is attached to a substrate with its active surface facing away from the substrate. Bonding wires electrically connect bonding pads formed on the active surface to connection terminals on the substrate or to leads of a lead frame. Since the wires protrude from the active surface of the semiconductor chip, and thus the substrate, reduction in thickness of the semiconductor package is difficult. For example, to avoid damage to the bonding wires of a lower semiconductor chip, a thick bonding material may provide an appropriate space between the lower semiconductor chip and an upper semiconductor chip. However, bonding material increases the overall thickness of the stack-type semiconductor package.

FIG. 1 is a cross-sectional view of a conventional stack-type chip semiconductor package. Referring to FIG. 1, using adhesives, two semiconductor chips 110 and 120 are attached to a substrate 100 where connection pads 102 are formed. Active surfaces of the semiconductor chips 110 and 120 face away from the substrate 100, and bonding pads are formed on the active surfaces. The bonding pads 112 and 122 are electrically connected to the connection pads 102 by bonding wires 124 and 114.

Referring to FIG. 1, the thickness of the adhesive 134 between the semiconductor chips 110 and 120 could be minimized by modifying the structure of the upper semiconductor chip 120, which in turn reduces the overall thickness of the semiconductor package. Since the wires of the upper semiconductor chip 120 protrude upwards however, a practical limit exists for reducing overall thickness of the semiconductor package.

SUMMARY OF THE INVENTION

The present invention provides a semiconductor chip package with reduced thickness and a method of manufacturing the same.

In one embodiment, a semiconductor package comprises a substrate having connection pads disposed thereon, a semiconductor chip attached to the substrate such that an active surface of the semiconductor chip faces the substrate, and external bonding pads electrically connected to the active surface of the semiconductor chip. The external bonding pads may be formed near the ends of the frame and have an upper surface facing away from the substrate. The external bonding pads are electrically connected with the connection pads.

According to an aspect of the present invention, there is provided a semiconductor package comprising a substrate having connection pads on the edges of an upper surface, a semiconductor chip, and wires for electrically connecting the connection pads of the substrate to the semiconductor chip. The semiconductor chip may then attach to the substrate using an insulating adhesive such that the active surface of the semiconductor chip faces the substrate. The semiconductor chip can comprise a frame and a protrusion unit protruding away from the frame. An active surface of the frame therefore may comprise internal bonding pads and conductive patterns from the internal bonding pads extending toward both ends of the frame. External bonding pads can be formed at both ends of the frame to not contact the protrusion unit. Upper surfaces of the external bonding pads may be exposed.

According to an aspect of the present invention, there is provided a method of manufacturing a single chip semiconductor package comprising: preparing a semiconductor chip including a frame having an active surface and a protrusion unit protruding from the frame, and preparing a substrate with bonding pads at either end. The active surface may comprise internal bonding pads and conductive patterns extending from the internal bonding pads toward both ends of the frame, and external bonding pads, the upper surface of which is exposed, connected to the conductive patterns, formed at both ends of the frame and not contacting the protrusion unit. The semiconductor chip may then attach to a substrate using an adhesive such that the active surface of the semiconductor chip faces the substrate. External bonding pads are bonded to the connection pads by wires.

According to an aspect of the present invention, there is provided a method of manufacturing the semiconductor chip comprising: forming the conductive patterns connecting the internal bonding pads to the scribe line regions of a wafer where a plurality of semiconductor chips are arrayed after forming the internal bonding pads, forming trenches by etching the scribe line regions of the wafer, forming the external bonding pads for filling the trenches with a conductive material, performing a first sawing along the surface of the wafer on the opposite side to which the external bonding pads are formed, along the scribe line region such that bottom surfaces of the external bonding pads are exposed wider than the width of the external bonding pads, and performing a sawing to separate the wafer into a plurality of individual semiconductor chips.

According to another aspect of the present invention, there is provided a stack-type chip semiconductor package with a reduced thickness and a method of manufacturing the same. In accordance with an aspect of the present invention, there is provided a stack-type chip semiconductor package comprising a substrate, a first semiconductor chip, a second semiconductor chip, a first wire, and a second wire. Connection pads may then be formed on the edges of an upper surface of the substrate.

The first semiconductor chip can attach to the substrate using an insulating adhesive such that an active surface of the first semiconductor chip faces the substrate. The first semiconductor chip may comprise a frame and a protrusion unit protruding from the frame, i.e., away from the substrate. The active surface of the frame comprises first internal bonding pads and first conductive patterns extending from the internal bonding pattern toward both ends of the frame. First external bonding pads may have upper surfaces which are exposed at both end of the frame and do not contact the protrusion units. The external bonding pads may connect to the first conductive patterns.

The second semiconductor chip may attach to the first semiconductor chip using an insulating adhesive such that an active surface of the second semiconductor chip faces toward the first semiconductor chip. The second semiconductor chip may comprise a frame and a protrusion unit protruding from the first semiconductor chip. The active surface formed on the bottom surface of the frame comprises second internal bonding pads, and second conductive patterns connected to the second internal bonding pads and extending from the second internal bonding pads toward both ends of the frame. Second external bonding pads may be formed at both ends of the frame without contacting the protrusion unit and may have an upper surface facing away from the exposed substrate.

The first wires can therefore connect the exposed surfaces of the first external bonding pads to the connection pads, and the second wires connect the exposed surfaces of the second external bonding pads to the connection pads.

The first semiconductor chip and the second semiconductor chip could be the same kind or different kinds of semiconductor chips.

In accordance with another aspect of the present invention, a method of manufacturing a stack-type chip semiconductor package comprises preparing first and second semiconductor chips, each of the first and the second semiconductor chips comprise a frame having an active surface and a protrusion unit protruding from the frame. The active surface may comprise internal bonding pads, conductive patterns extending from the internal bonding pads toward both ends of the frame, and external bonding pads with exposed upper surfaces formed at both ends of the frame and not contacting the protrusion unit. The method may comprise attaching a first semiconductor chip to a substrate using an adhesive such that an active surface of the semiconductor chip faces the substrate, bonding external bonding pads of the first semiconductor chip to connection pads disposed on the substrate by wires, attaching a second semiconductor chip to the protrusion unit of the first semiconductor chip using an insulating adhesive such that an active surface of second semiconductor chip faces the first semiconductor chip, and bonding external bonding pads of the second semiconductor chip to the connection pads by wires.

DETAILED DESCRIPTION OF THE INVENTION

Figure 1:
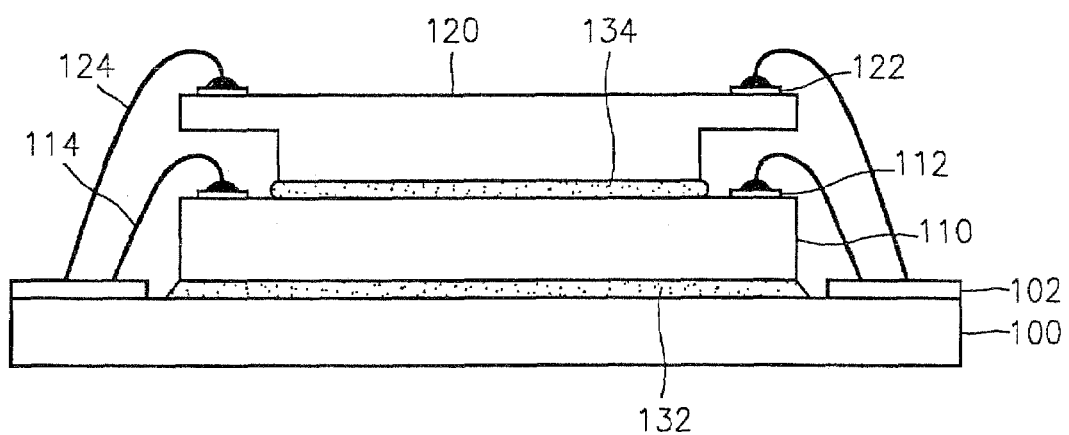
FIG. 1 is a cross-sectional view of a conventional stack-type chip semiconductor package.

Hereinafter, the present invention will be described more fully with reference to the accompanying drawings showing embodiments of the invention. This invention may, however, be embodied in different forms and should not be construed as being limited to the embodiments in this description, rather, these embodiments are provided to make this disclosure thorough and fully convey the concept to those skilled in the art. In the drawings, dimensions are exaggerated for clarity. To facilitate understanding, similar reference numerals are used to designate elements common to the figures.

FIGS. 2 through 6B depict a method of manufacturing a semiconductor package according to an embodiment of the present invention.

Figure 2:
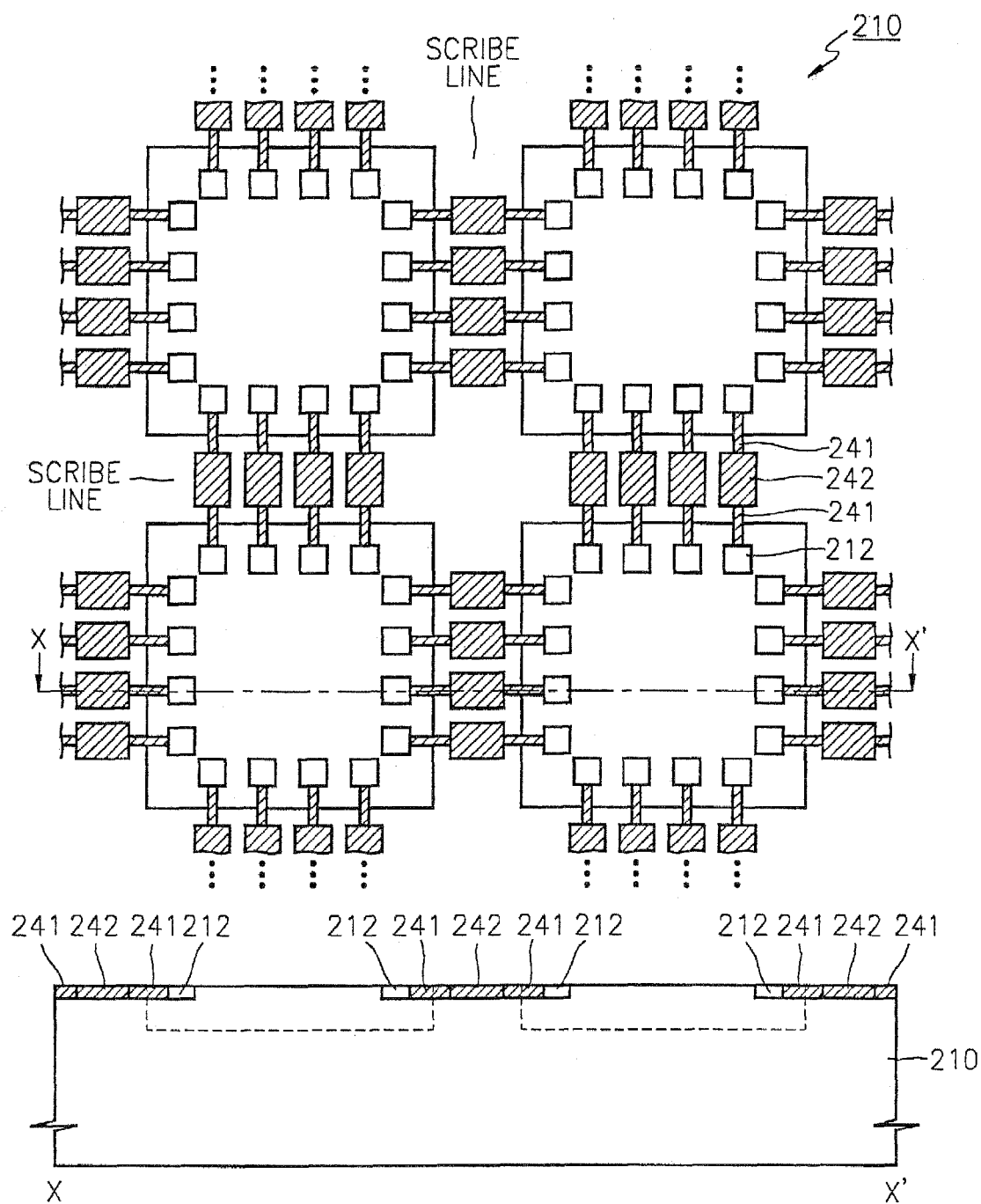
FIGS. 2 through 4 depict a method of manufacturing a semiconductor chip to be used for a stack-type chip semiconductor package according to an embodiment of the present invention.

FIG. 2 is a plane view of a wafer 210 in which a fab process has been completed, and a cross-sectional view along a line X-X'. The wafer 210 comprises a plurality of semiconductor devices arranged in a matrix, where scribe lines represent division lines between each of the semiconductor devices.

In an internal area of a semiconductor device (the dotted region in the cross-sectional drawing), an integrated circuit (not showing) is formed. The embodiment in FIG. 2 shows only a plane arrangement of the internal bonding pads 212, but other arrangements accord with the present invention. The internal bonding pads 212 may be located on edges of a wafer, but can also be arranged, for example, on opposite ends of a semiconductor chip, or in a row of the center of the semiconductor chip.

Conductive patterns 241 and 242 on the wafer 210 may be formed on scribe lines as shown in FIG. 2. Each of the conductive patterns 241 and 242 may electrically connect to at least one of the bonding pads 212. The conductive patterns 241 and 242 can be formed to extend to the scribe lines. Conductive patterns 242 are preferably formed to include a predetermined area for an electrical connection. To simplify a manufacturing process, the conductive pattern 242 can be formed in combination with a conductive pattern 242 of an adjacent semiconductor device.

The conductive patterns 241 and 242 may be advantageously formed using the same process as an internal bonding pad 212. Therefore, the conductive patterns 241 and 242 can have the same height and material as the internal bonding pads 212. However, the conductive patterns 241 and 242 can also be formed over the internal bonding pads 212 by forming the conductive pattern 241 and 242 after the internal bonding pads 212.

Figure 3:
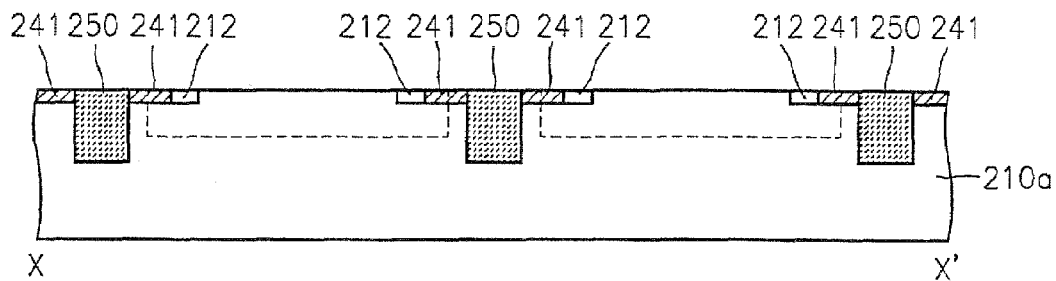

Referring to the example in FIG. 3, after the conductive patterns 241 and 242 are formed, trenches are formed, for example by etching the predetermined portion of the scribe line of the wafer 210 using a photolithographic process. The trenchers are formed deeper than the thickness of an integrated circuit layer formed on an active surface of the semiconductor device. Examples of trench formation include forming trenches within the conductive pattern 242, or forming trenches in a region connecting to any of the conductive patterns 241 and 242. The trenches can then be filled with any conductive material, for example, copper. As a result, external bonding pads 250 connect with the internal bonding pads 212 via the conductive patterns 241.

Next, a back surface of the wafer 210 can be ground to a desired thickness, for example, by a back grinding process. The back grinding process reduces the overall thickness of the package but is not a requirement. The back grinding process may provide a thicker wafer 210a than the depth of the bonding pads 250.

Next, a dicing process may separate the wafer 210a, including the external bonding pad 250, into individual semiconductor chips. The dicing process may comprise two steps.

Figure 4:
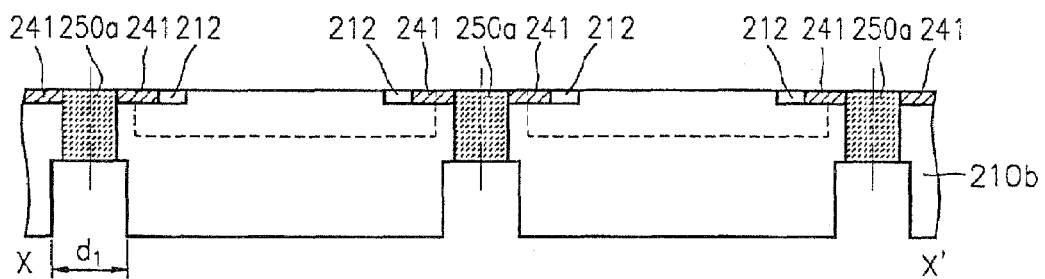

Referring to FIG. 4, a first sawing process may be performed on the bottom surface of the scribe lines, i.e., on the opposite surface of the wafer 210a to which the external bonding pads 250 are formed. In the first sawing process, a wafer 210a may be sawed to the depth of an external bonding pad 250, exposing the bottom of the external bonding pads 250.

The sawing process may advantageously have a width d1 equal to or greater than the width of the external bonding pads 250. For this purpose, a blade that is wider than the external bonding pad 250 may saw the back surface of the wafer 210a. However, the width of the blade should be less than the width of the scribe lines.

Next, a second and narrower sawing process may use a blade or a laser beam, or any other wafer sawing method, to saw the wafer. The resultant product is depicted in FIG. 5.

Figure 5:
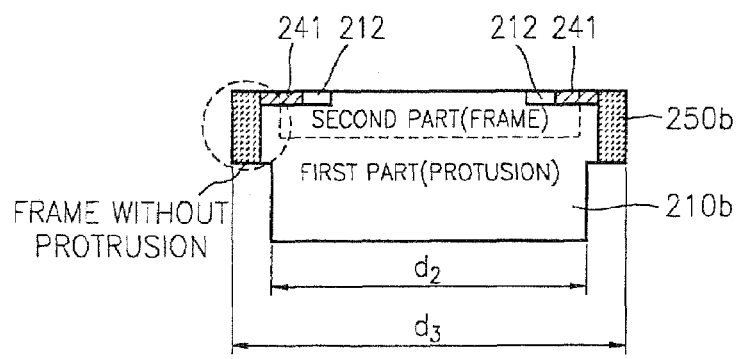
FIG. 5 is a cross-sectional view of a semiconductor chip to be used for a semiconductor package according to another embodiment of the present invention.
Figure 6:
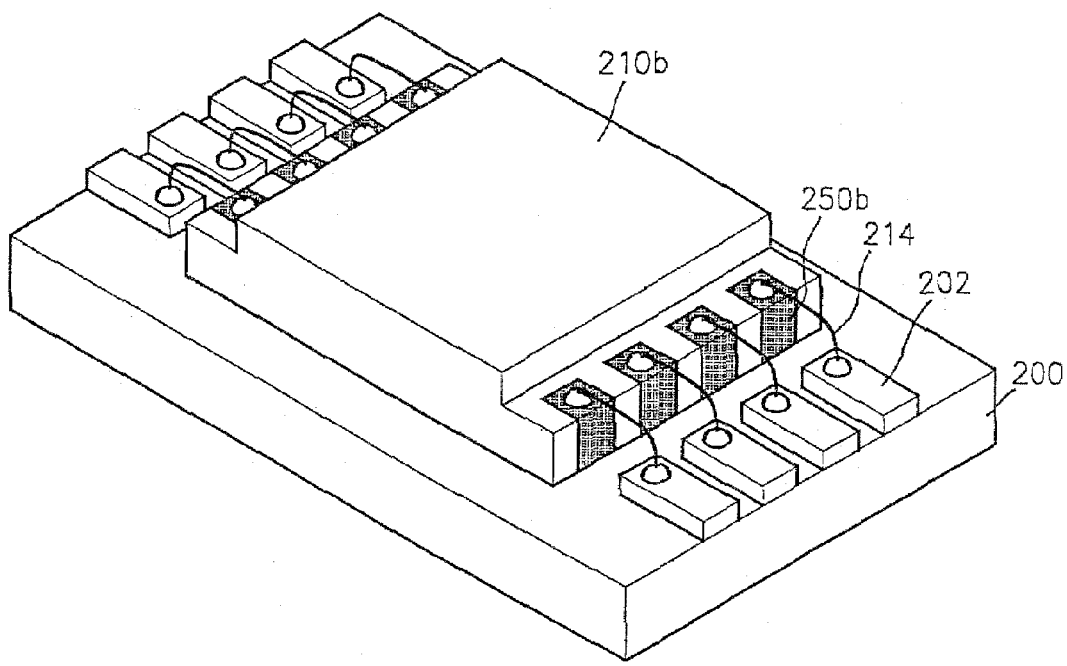
FIGS. 6A and 6B are a perspective view and a cross-sectional view, respectively, of a single chip semiconductor package according to still another embodiment of the present invention.
Figure 6:
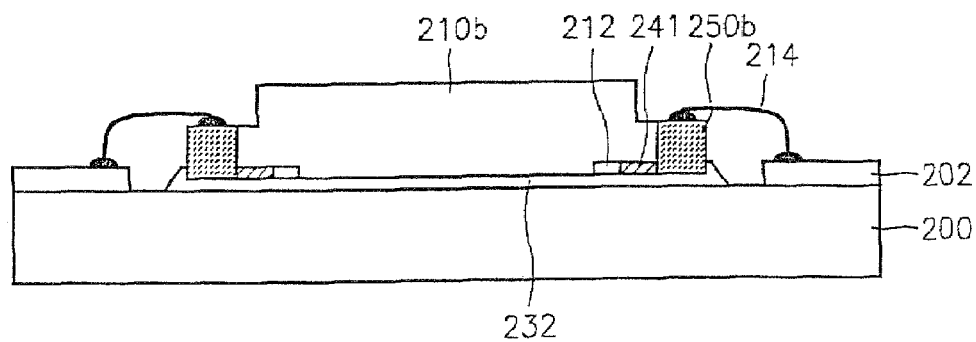

Referring to FIG. 5, the semiconductor chip 210b may comprise a first part of the semiconductor chip having a substantially rectangular shape with a first width D2, and a second part of the semiconductor chip having a substantially rectangular shape with a width D3, which is greater than the first width D2, and the second part of the semiconductor chip is on top of the first part of the semiconductor chip. The second part of the semiconductor chip becomes a frame when the semiconductor chip 210b is turned over while the first part of the semiconductor chip becomes a protrusion unit on the frame. That is, the semiconductor chip 210b comprises a frame and a protrusion unit, and no protrusion unit is formed on either edge of the frame. The regions that may not include the protrusion unit include the edges, which have been sawed, and can include the other two edges, i.e., front and rear edges.

An active surface is formed on the second part of the semiconductor chip, that is, the exposed surface of the frame, and internal bonding pads 212 and conductive patterns 241 are formed on the active surface. External bonding pads 250b are formed on the frame, for example where no protrusion units are formed, such that at least one surface of the external bonding pads 250b is exposed to the protrusion units. The external bonding pad 250b is electrically connected to the internal bonding pads 212, for example, via the conductive pattern 241.

FIGS. 6A and 6B are a perspective view and a cross-sectional view, respectively, of a single chip semiconductor package comprising the semiconductor chip 210b as depicted in FIG. 5 according to an embodiment of the present invention. A single chip semiconductor package as depicted in FIGS. 6A and 6B may be manufactured as the following method.

First, the semiconductor chip 210b, as depicted in FIG. 5, attaches to a substrate 200 using an insulating adhesive 232. The semiconductor chip 210b is attached to the substrate 200 such that the active surface of the semiconductor chip 210b faces toward the substrate 200. Here, the substrate can be one of a printed circuit substrate, a film type substrate, and a lead frame. A connecting pad 202 for electrical connection to the semiconductor chip 210b is formed on the substrate 200.

Next, a wire bonding process is performed, connecting the upper surfaces of the external bonding pads 250b to the connection pads 202 by wires 214. The wire bonding process can be performed using a conventional technique, such as a forward ball bonding method, a bump reverse ball bonding method, or a wedge bonding method. Since the disclosed surface of the external bonding pads 250b is lower than the height of the semiconductor chip 210b, the bonding wire 214 can be formed such that the wires do not protrude above the semiconductor chip 210b. The formation of a single chip semiconductor package can be completed using conventional processes for manufacturing a semiconductor package including a molding process (not shown).

Since the height of the wires 214 is lower than the height of the semiconductor chip 210b, that is, the protrusion unit, a resin used for molding can be formed as low as possible. Accordingly, the overall thickness of the semiconductor package can be reduced because the resin used for molding does not need to protrude very high.

Figure 7A:
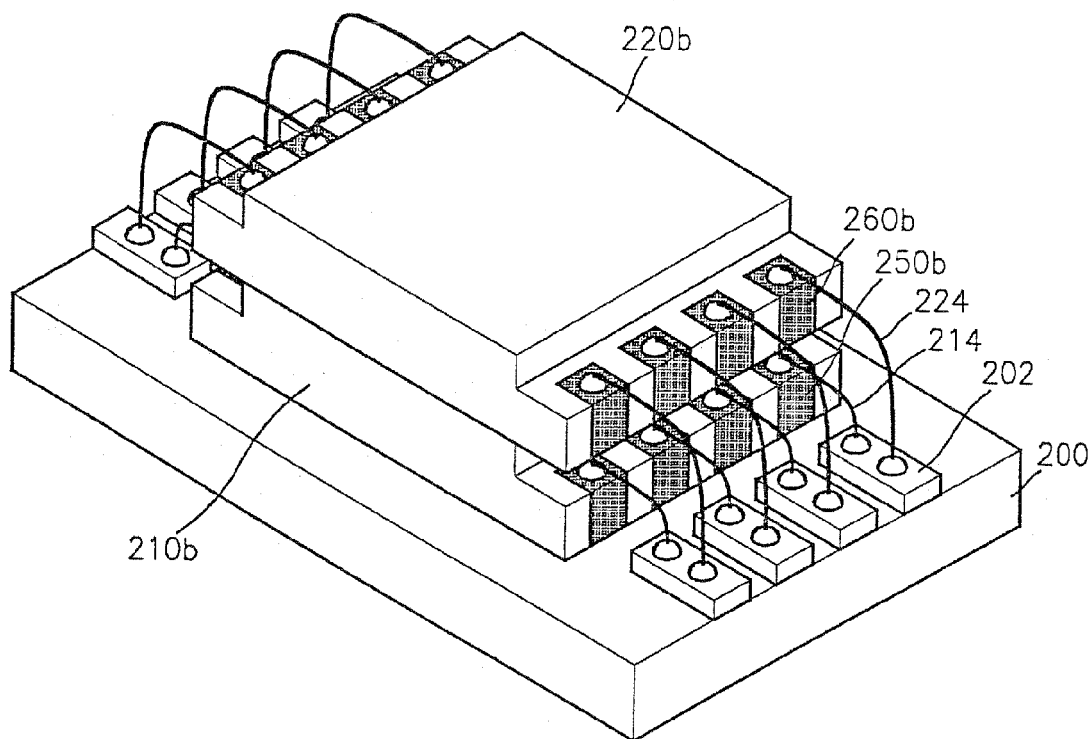
FIGS. 7A and 7B are a perspective view and a cross-sectional view, respectively, of a stack-type chip semiconductor package according to yet another embodiment of the present invention.
Figure 7B:
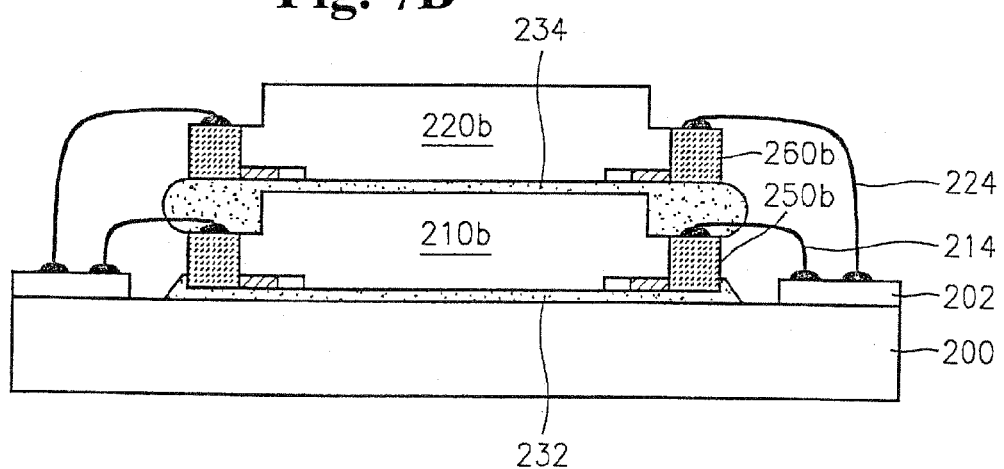

FIGS. 7A and 7B are a perspective view and a cross-sectional view, respectively, of a stack-type chip semiconductor package according to another embodiment of the present invention. The structure of the stack-type chip semiconductor package in FIG. 7 shows a stacking of only two semiconductor chips. However, an embodiment of the present invention can be applied using the same method to a stack-type chip semiconductor package formed of more than two semiconductor chips. The method of manufacturing the stack-type chip semiconductor package as depicted in FIG. 7 is described below.

Referring to FIG. 7, a lower semiconductor chip 210b and an upper semiconductor chip 220b may be prepared using the same method as the foregoing descriptions in reference to the FIGS. 2 through 5, that is, two semiconductor chips as depicted in FIG. 5 are prepared. The lower semiconductor chip 210b and the upper semiconductor chip 220b may be the same kind of semiconductor devices, or they may be different kinds of semiconductor devices.

Next, the lower semiconductor chip 210b is attached to the substrate 200 using an insulating adhesive 232, and the external bonding pads 250b are electrically connected to the connection pads 202 by wires 214. When the lower semiconductor chip 210b is a different kind of semiconductor chip than the upper semiconductor chip 220b, additional connection pads can be further formed for electrically connecting the upper semiconductor chip 220b.

Next, the upper semiconductor chip 220b is attached to the lower semiconductor chip 210b. For this purpose, an insulating adhesive 234 may be applied to the lower semiconductor chip 210b in advance. Then, the upper semiconductor chip 220b can be placed on the adhesive 234 so that the active surface faces toward the lower semiconductor chip 210b, and then the two chips are bonded. Another wire bonding process for connecting the external bonding pads 260b of the upper semiconductor chip 220b to the connection pads 202 is then performed. The method of wire bonding of the upper semiconductor chip 220b can be performed using a conventional method.

According to an embodiment of the present invention, the adhesive 234 does not need to have a large thickness since the height of the wires 214 of the lower semiconductor chip 210b is lower than the height of the lower semiconductor chip 210b, and so the wires 214 do not contact the upper semiconductor chip 220b. Also, the wires 224 of the upper semiconductor chip 220b are lower than the height of the upper semiconductor chip 220b. Therefore, the overall thickness of the stack-type chip semiconductor package is reduced.

A single chip semiconductor package according to an embodiment of the present invention is thin and is light weight. Therefore, such a semiconductor package enables the manufacturing of thin and light mobile electronic devices. Also, the single chip semiconductor package has a simple manufacturing process, especially, since the process utilizes the scribe lines of a semiconductor wafer, the productivity is not impaired.

A stack-type chip semiconductor package according to an embodiment of the present invention is thin and light weight, and enables manufacturing of integrated circuits with a greater packaging density and production of a high performance semiconductor package. Accordingly, an electronic device comprising a stack-type chip semiconductor package being thin, light and having high performance, and high density integrated circuits can be manufactured.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a single chip semiconductor package comprising:
    preparing a semiconductor chip comprising a frame having an active surface, and a protrusion unit protruding away from the frame, wherein the active surface comprises internal bonding pads, conductive patterns connected to the internal bonding pads and extending from the internal bonding pads toward ends of the frame, and external bonding pads connected to the conductive patterns, the external bonding pads formed at opposite ends of the frame and having an exposed upper surface;
    preparing a substrate with connection pads;
    attaching the semiconductor chip to the substrate using an adhesive such that the active surface of the semiconductor chip faces toward the substrate; and
    electrically connecting the external bonding pads with the connection pads.

2. The method of claim 1, wherein the external bonding pads are formed in scribe line regions of a wafer.

3. The method of claim 2, wherein the external bonding pads are formed of copper.

4. The method of claim 2, wherein preparing the semiconductor chip comprises:
    forming the conductive patterns connecting the internal bonding pads to the scribe line regions of the wafer where a plurality of semiconductor chips are arrayed after forming the internal bonding pads;
    forming trenches by etching the scribe line regions of the wafer;
    forming the external bonding pads for filling the trenches with a conductive material;
    performing a first sawing along the surface of the wafer on the opposite side to which the external bonding pads are formed, along the scribe line region such that bottom surfaces of the external bonding pads are exposed wider than the width of the external bonding pads; and
    performing a second sawing to separate the wafer into a plurality of individual semiconductor chips.

5. The method of claim 4, further comprising grinding the back surface of the wafer after forming the external bonding pads.

6. The method of claim 4, wherein the internal bonding pads and the conductive patterns are formed at the same time.

7. The method of claim 4, wherein the second sawing uses a blade having a narrower width than the width of the external bonding pads or a laser beam to saw the wafer.

8. A method for manufacturing a stacked type chip semiconductor package comprising:
    preparing first and second semiconductor chips, each of which includes a frame having an active surface formed on a lower surface of the frame and a protrusion unit protruding away from the frame wherein the active surface includes internal bonding pads and conductive patterns connected to the internal bonding pads and extending from the internal bonding pads toward ends of the frame, and external bonding pads connected to the conductive patterns, the external bonding pads formed at opposite ends of the frame and having an exposed upper surface;
    preparing a substrate with connection pads;
    attaching the first semiconductor chip to the substrate using an adhesive such that the active surface of the semiconductor chip faces the substrate;
    bonding the external bonding pads of the first semiconductor chip to the connection pads with wires;
    attaching the second semiconductor chip to the protrusion unit of the first semiconductor chip using an insulating adhesive such that the active surface of the second semiconductor chip faces the first semiconductor chip; and
    bonding the external bonding pads of the second semiconductor chip to the connection pads with wires.

9. The method of claim 8, wherein the external bonding pads of the first semiconductor chip and the external bonding pads of second semiconductor chip are formed within a region of a scribe line of a wafer.

10. The method of claim 8, wherein preparing the first semiconductor chip and the second semiconductor chip comprising:
    forming the conductive patterns connecting the internal bonding pads to the scribe line regions of the wafer where a plurality of semiconductor chips are arrayed after forming the internal bonding pads;

forming trenches by etching the scribe line regions of the wafer;

forming the external bonding pads for filling the trenches by a conductive material;

performing a first sawing along the surface of the wafer on the opposite side to which the external bonding pads are formed, along the scribe line such that the bottom surfaces of the external bonding pads are exposed wider than the width of the external bonding pad; and performing a second sawing to separate the wafer into a plurality of individual semiconductor chips.

11. The method of claim 10, further comprising grinding the back surface of the wafer after forming the external bonding pads.

12. The method of claim 8, wherein the first semiconductor chip and the second semiconductor chip are the same kind of semiconductor chips.

13. The method of claim 8, wherein the first semiconductor chip and the second semiconductor chip are different kinds of semiconductor chips.

* * * * *